United States Patent
Bukkems et al.

(10) Patent No.: US 9,732,912 B2
(45) Date of Patent: Aug. 15, 2017

(54) FLAT LIGHTING DEVICE

(71) Applicant: PHILIPS LIGHTING HOLDING B.V., Eindhoven (NL)

(72) Inventors: Peter Johannes Martinus Bukkems, Deurne (NL); Peter Rijskamp, Venray (NL); Simon Eme Kadijk, Veldhoven (NL); Johannes Petrus Maria Ansems, Hulsel (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/649,239

(22) PCT Filed: Dec. 5, 2013

(86) PCT No.: PCT/IB2013/060666
§ 371 (c)(1),
(2) Date: Jun. 3, 2015

(87) PCT Pub. No.: WO2014/087366
PCT Pub. Date: Jun. 12, 2014

(65) Prior Publication Data
US 2015/0316213 A1 Nov. 5, 2015

Related U.S. Application Data

(60) Provisional application No. 61/733,476, filed on Dec. 5, 2012.

(30) Foreign Application Priority Data

Dec. 5, 2012 (EP) .................................. 12195700
Mar. 19, 2013 (EP) .................................. 13159889
Mar. 19, 2013 (EP) .................................. 13159895

(51) Int. Cl.
*F21V 1/00* (2006.01)
*F21V 11/00* (2015.01)
(Continued)

(52) U.S. Cl.
CPC ................ *F21K 9/135* (2013.01); *F21K 9/23* (2016.08); *F21K 9/232* (2016.08); *F21K 9/60* (2016.08);
(Continued)

(58) Field of Classification Search
CPC ... F21K 9/13; F21K 9/135; F21K 9/50; F21K 9/52; F21K 9/90; F21V 3/02;
(Continued)

(56) References Cited

U.S. PATENT DOCUMENTS 5,463,280 A * 10/1995 Johnson .................. F21K 9/135
315/187
5,749,646 A 5/1998 Brittell
(Continued)

FOREIGN PATENT DOCUMENTS

EP 2058584 A1 5/2009
EP 2295853 A1 3/2011
(Continued)

*Primary Examiner* — Alexander Garlen (57) ABSTRACT

The present invention relates to a lighting device (11) comprising a light emitting portion with at least two solid state light sources, SSL (18). The light emitting portion includes a first cover member (12a) with a first light source carrier (13a) and a first light transmitting portion (14), a second cover member (12b) with a second light source carrier (13b) and a second light transmitting portion (14). The first and second cover member are arranged such that a first light transmitting portion is aligned with the second SSL to allow transmission of light emitted from the second SSL through the first cover member, and a second light transmitting portion is aligned with the first SSL to allow
(Continued)

transmission of light emitted from the first SSL through the second cover member. According to this design, light emitted from an SSL on one cover member will be transmitted through the other cover member. Dissipation of heat from each SSL may be provided in the other direction, i.e. in a direction opposite to the light emitting direction of each SSL.

14 Claims, 5 Drawing Sheets

(51) Int. Cl.
*F21K 99/00* (2016.01)
*F21V 29/503* (2015.01)
*H05K 1/02* (2006.01)
*H05K 1/18* (2006.01)
*F21V 29/506* (2015.01)
*F21V 29/70* (2015.01)
*F21V 23/00* (2015.01)
*F21K 9/23* (2016.01)
*F21K 9/232* (2016.01)
*F21K 9/60* (2016.01)
*F21K 9/61* (2016.01)
*F21V 29/74* (2015.01)
*F21V 29/80* (2015.01)
*F21V 5/04* (2006.01)
*F21V 7/22* (2006.01)
*F21V 15/01* (2006.01)
*F21V 19/00* (2006.01)
*F21K 9/90* (2016.01)
*F21V 3/02* (2006.01)
*F21Y 105/10* (2016.01)
*F21Y 115/10* (2016.01)
*F21Y 107/90* (2016.01)

(52) U.S. Cl.
CPC .................. *F21K 9/61* (2016.08); *F21V 5/04* (2013.01); *F21V 7/22* (2013.01); *F21V 15/01* (2013.01); *F21V 19/003* (2013.01); *F21V 19/006* (2013.01); *F21V 23/003* (2013.01); *F21V 29/503* (2015.01); *F21V 29/506* (2015.01); *F21V 29/70* (2015.01); *F21V 29/74* (2015.01); *F21V 29/80* (2015.01); *H05K 1/0209* (2013.01); *H05K 1/189* (2013.01); *F21K 9/90* (2013.01); *F21V 3/02* (2013.01); *F21Y 2105/10* (2016.08); *F21Y 2107/90* (2016.08); *F21Y 2115/10* (2016.08); *H05K 2201/10106* (2013.01)

(58) Field of Classification Search
CPC .... F21V 23/003; F21V 29/503; F21V 29/506; F21V 29/70; H05K 1/189; H05K 1/0209; H05K 2201/10106; F21Y 2101/02; F21Y 2105/001
See application file for complete search history.

(56) References Cited

U.S. PATENT DOCUMENTS

| | | | | |
|---|---|---|---|---|
| 2004/0239242 | A1* | 12/2004 | Mano | F21K 9/135 313/512 |
| 2005/0189557 | A1* | 9/2005 | Mazzochette | F21K 9/00 257/100 |
| 2009/0161359 | A1* | 6/2009 | Siemiet | F21S 4/28 362/235 |
| 2011/0063838 | A1 | 3/2011 | Dau et al. | |
| 2012/0002425 | A1 | 1/2012 | Shimizu et al. | |
| 2012/0069570 | A1 | 3/2012 | Marinus et al. | |
| 2012/0319554 | A1* | 12/2012 | Ter Weeme | F21K 9/135 313/46 |

FOREIGN PATENT DOCUMENTS

| | | | | |
|---|---|---|---|---|
| FR | 2926926 | A1 | 7/2009 | |
| GB | 2367883 | A | 4/2002 | |
| NL | WO 2010136950 | A1 * | 12/2010 | ............... F21V 3/02 |
| WO | 2011107925 | A1 | 9/2011 | |
| WO | 2012095758 | A2 | 7/2012 | |
| WO | 2013056516 | A1 | 4/2013 | |
| WO | 2014087357 | A1 | 6/2014 | |
| WO | 2014087363 | A1 | 6/2014 | |

* cited by examiner

FLAT LIGHTING DEVICE

CROSS-REFERENCE TO PRIOR APPLICATIONS

This application is the U.S. National Phase application under 35 U.S.C. §371 of International Application No. PCT/IB13/060666, filed on Dec. 05, 2013, which claims the benefit of U.S. Provisional Patent Application No. 61/733, 476, filed on Dec. 05, 2012, European Patent Application No. 12195700.5 filed on Dec. 05, 2012, and European Patent Application No. 13159889.8 filed on Mar. 19, 2013, European Patent Application No. 13159895.5 filed on Mar. 19, 2013. These applications are hereby incorporated by reference herein.

FIELD OF THE INVENTION

The present invention relates to flat lighting device comprising solid state light sources (SSL), and more specifically to flat lamps.

BACKGROUND OF THE INVENTION

Conventional electric LED lamps comprise a printed circuit board with LEDs arranged onto it. The printed circuit board is arranged in a horizontal manner when arranging the LED lamp in a standing position, or, if defining a longitudinal axis of the LED lamp, arranged with an angle to the longitudinal axis. In front of the printed circuit board in a light exit direction, a plastic or glass bulb is arranged in order to manipulate the emitted light from the LEDs, and to protect components inside the lamp. Below the printed circuit board, a number of components are arranged with the main purpose of spreading and transferring the heat generated by the LEDs. These may be a heat spreader, heat fins, a metal housing and a cap. Such LED lamp hence comprises a large number of components in order to perform all tasks of the lamp such as generating and distributing light, transferring heat, protect the electric connections and provide a fire enclosure.

An alternative LED lamp is disclosed in WO2011/107925A1, wherein a printed circuit board with a LED is arranged on a reflector. Such solution decreases the amount of components in the lamp. However, such lamp may not completely replace a conventional LED lamp in respect to optical performance. Further, such arrangement may be sensitive to physical actuation and may not provide sufficient thermal properties for high lumen lamps.

Consequently, there is a need for a lamp that in a protective manner further increases the effectiveness in providing a lamp with sufficient optical, mechanical and thermal properties.

SUMMARY OF THE INVENTION

It is an object of the present invention to overcome this problem, and to provide a lighting device that provides effective light generation, distribution and heat management.

According to a first aspect of the invention, this and other objects are achieved by a light emitting portion with at least two solid state light sources, SSL. The light emitting portion includes a first cover member with a first light source carrier and a first light transmitting portion, a second cover member with a second light source carrier and a second light transmitting portion, a first SSL mounted on the first light source carrier, and a second SSL mounted on the second light source carrier. The first and second cover member are arranged with the first light source carrier facing the second light source carrier, such that the first light transmitting portion is aligned with the second SSL to allow transmission of light emitted from the second SSL through the first cover member, and the second light transmitting portion is aligned with the first SSL to allow transmission of light emitted from the first SSL through the second cover member.

According to this design, one or several SSLs may be arranged in each of the two cover members. Light emitted from an SSL on one cover member will be transmitted through the other cover member. Dissipation of heat from each SSL may be provided in the other direction, i.e. in a direction opposite to the light emitting direction of each SSL. Details of exemplary heat dissipation solutions are outlined in the dependent claims.

The first cover member and the second cover member are preferably of essentially equal geometrical design. This enables efficient manufacture and thus a cost effective lighting device. It is specifically noted that by providing an SSL and a light transmitting part on opposite positions of a line of symmetry, each SSL will be aligned with a light transmitting part when one cover member is turned around the line of symmetry to face the other cover member.

The first and second SSL carrying surfaces may be non-flat. As a consequence, the light emitting directions of different SSLs will be non-parallel, enabling a better spread of light.

The light transmitting portions may include openings extending through the first and second light source carrier, respectively. In order to enhance the optical performance, the light transmitting portions may further include an optical structure adapted to direct emitted light from the SSL out of the lighting device.

According to one embodiment, the first light source carrier comprises a first heat conducting layer on which the first SSL is arranged, such that an amount of heat generated by the first SSL is transmitted into the first layer, and the second light source carrier comprises a second heat conducting layer on which the second SSL is arranged, such that an amount of heat generated by the second SSL is transmitted into the second layer. The first layer is in thermal contact with the first cover member, and the second layer is in thermal contact with the second cover member, so that a majority of the heat transmitted into the first layer from the first light source, and into the second layer from the second light source, is transmitted into the first and second cover member respectively.

As the first and second cover member form the outer surface of the lighting device, such heat conducting layers will thus provide efficient heat dissipation away from the light source and to the ambient.

The first and second heat conducting layer are preferably formed by a first and second structured electrode layer, respectively, wherein each SSL is electrically and thermally connected to one of the electrode layers, and wherein a driver circuitry is electrically connected to each electrode layer. Such a combined electrode and thermal interface layer preferably covers a large portion, e.g. 90%, of each SSL carrying surface, to provide a sufficiently good thermal interface to the first and second cover member.

At least one electrode may be arranged to connect the first electrode layer to the driver circuitry, and at least one electrode may be arranged to connect the second electrode layer to said driver circuitry. Such electrodes may be adapted to be biased, e.g. spring loaded, against a driver carrier with the driver circuitry which is sandwiched between the two cover members.

The first and second cover member may each include a housing, wherein the light source carrier is formed by a separate carrier arranged in the housing, and the structured electrode layer is provided on the separate carrier. Alternatively, the first and second light source carrier is formed by an inner surface of the housing, and an electrode layer is formed directly on the inner surface

BRIEF DESCRIPTION OF THE DRAWINGS

The present invention will be described in more detail with reference to the appended drawings, showing currently preferred embodiments of the invention.

DETAILED DESCRIPTION

In the following description, the present invention will be described with reference to various examples of flat lamps. However, the invention should not be perceived as limited to such lamps.

Figure 1:
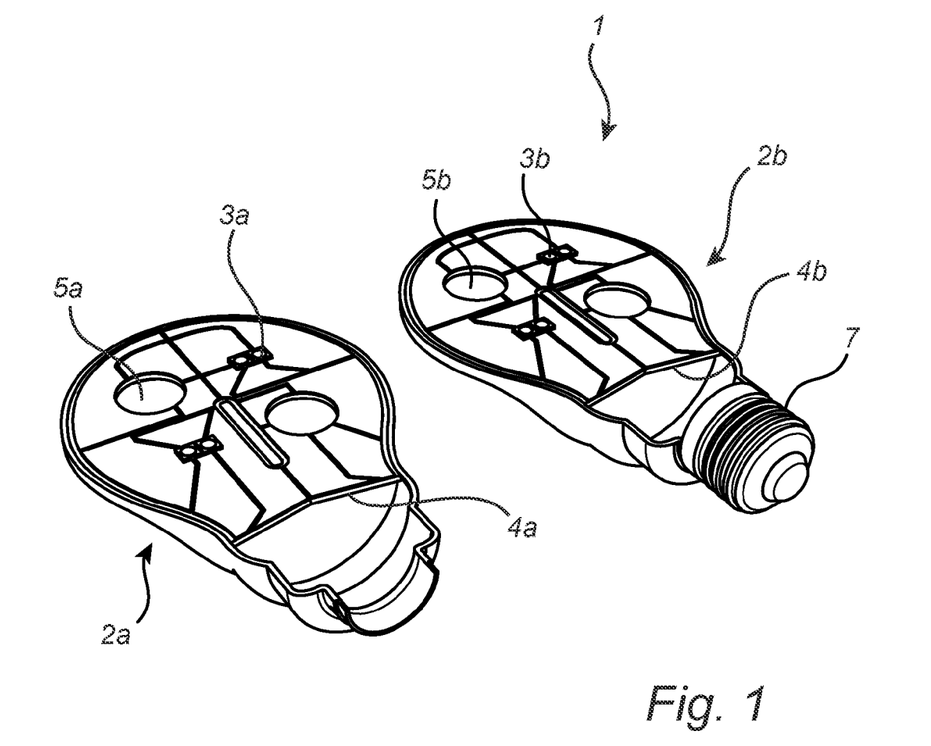
FIG. 1 shows a flat lamp according to a first embodiment of the present invention.

The lamp 1 in FIG. 1 comprises two cover members 2a, 2b, each with light sources 3a, 3b, such as solid state light sources, SSL, mounted on a light source carrier 4a, 4b. The light sources may be LEDs, OLEDs, PLEDs or the like. The light source carrier 4a, 4b may be formed as an integrated part of the cover member 2a, 2b, e.g. by printing the electrical connections on an inner surface of the cover member. Alternatively, the light source carrier 4a, 4b is a separate carrier, such as a PCB, mounted in the cover member. The conducting layer of the light source carrier may be configured to also have a heat spreading effect, and may serve to conduct heat from the light sources 3a, 3b to the cover members 2a, 2b to be further dissipated to the ambient. The light source carrier 4a, 4b is provided with openings 5a, 5b, possibly fitted with optical structures, such as lenses (not shown). An opening 5a is arranged on one of the cover members 2a such that it is aligned with a corresponding light source 3b on the other cover member 2b. The openings 5a, 5b and light sources 3a, 3b are arranged in an alternated manner. The two cover members are adapted to be assembled together with the light source carriers 4a, 4b facing each other to form a lamp. The bulb further comprises an electrical fitting 7, here a conventional threaded fitting, for mechanically and electrically connecting the lamp to a socket.

Figure 2:
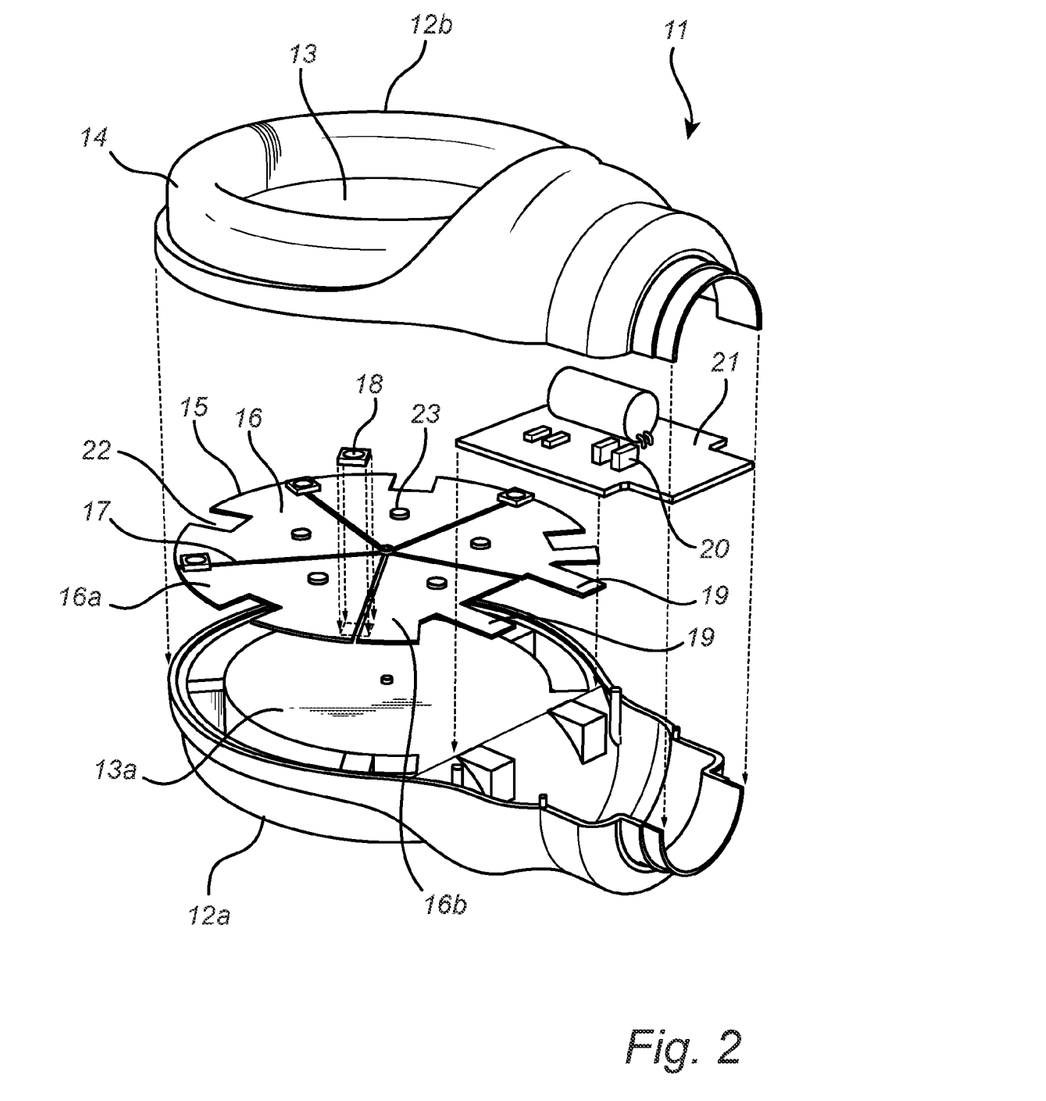
FIG. 2 shows a flat lamp according to a second embodiment of the present invention.

The flat lamp 11 in FIG. 2 also has two, preferably geometrically identical, cover members 12a, 12b. Each member 12a, 12b has an essentially flat central area 13, surrounded by a hollow ridge 14 (or groove as seen from the inside). The ridge 14, and possibly the entire cover member, is made of a transparent material. A light source carrier is formed by the inside surface 13a of the flat area 13, on which a structured electrically and thermally conducting layer 15 is provided. The layer may be copper. The layer 15 is in thermal contact with the cover member. In one embodiment, the layer 15 is formed directly on the inside surface 13a.

In the embodiment in FIG. 2, the conducting layer 15 is structured into several (here five) pie-shaped pads 16. The pads are separated by radially extending lines 17. Along each line 17 is mounted a light source 18, here a solid state light source (SSL), with one terminal connected to a first pad 16a, and a second terminal connected to an adjacent pad 16b. Hereby the SSLs 18 are serially connected by the pads 16, to form a serially connected string of SSLs.

The two pads in the neck portion of the bulb 11 have tongue-shaped electrodes 19 extending towards the neck. These electrodes may be electrically connected to driver circuitry 20. In one embodiment, the driver circuitry is arranged on a driver carrier 21, such as a PCB, and the electrodes 19 are spring loaded against the driver carrier 21. The driver carrier 21 may be adapted to have one side connected to the electrodes of a first cover member 12a, and the opposite side connected to the electrodes of a second cover member 12b. By contacting the electrodes 19, the driver circuitry 20 is connected to the SSL string, and may operate the SSLs 18 to emit light.

In the periphery of the layer 15 there are formed openings 22 providing access to the groove shaped inside 14a of the ridge 14. The openings are located such that, when the two cover members are assembled together to form a lamp 11, each opening 22 will be opposite an SSL 18. Light from an SSL 18 will thus pass through an opening 22 and enter the inside 14a of the ridge 14, where it will mix and eventually be emitted through the transparent wall of the cover member 12a, 12b.

The transparent material in the ridge 14 may diffuse and/or collimate the light. If adequate, an additional optical structure may be provided in the opening 22 to further shape the emitted light. The optical structure may be a lens, a light guide or an optical scattering device.

A significant portion of heat generated in the SSLs will be transferred to the layer 15, and further to the cover member 12a, 12b, where it will be dissipated into the ambient. Due to the relatively large size of the pads 16, a satisfactory thermal interface from the SSL, via the layer 15, to the cover member, is achieved.

On the conducting layer 15 are provided one or several protruding elements 23. When the cover members are assembled together, these elements 23 will ensure that the conducting layers 15 of each cover member do not make contact. In order to avoid light to enter the small gap formed between the two layers 15, each SSL 18 may protrude out of the plane of the conducting layer, such that, when the cover members are assembled together, the SSL will extend into the corresponding opening beyond the plane of the other conducting layer.

Figure 3:
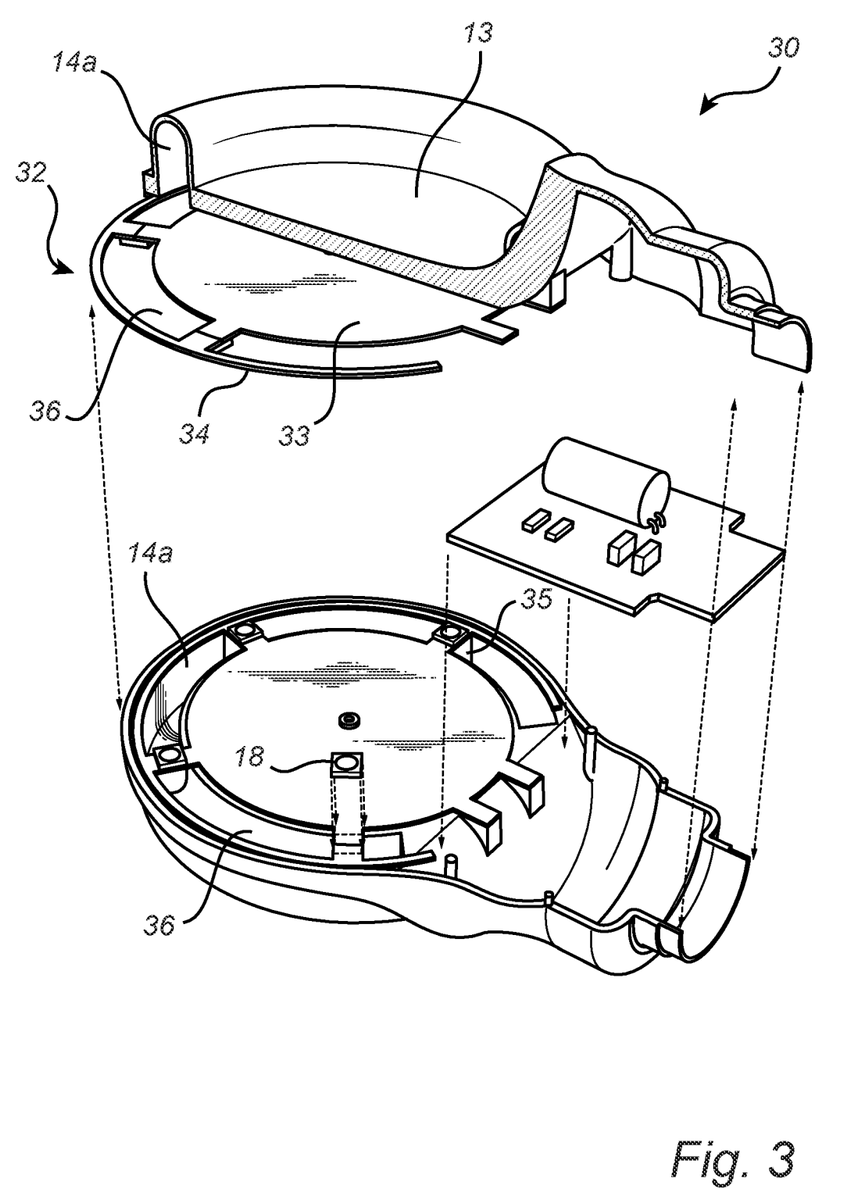
FIG. 3 shows a flat lamp according to a third embodiment of the present invention.

The lamp 30 in FIG. 3 is similar in design as the lamp 11 in FIG. 2, and identical or similar parts have been given the same reference numbers.

The conducting layer 32 of the light source carrier is here structured differently than the layer 15 in FIG. 2. Here, the layer 32 includes a large central pad 33 surrounded by a peripheral ring 34. The central pad 33 has a size matching the flat area 13 of the cover member 12, and the inside of the ridge 14 extends to form a groove 14a between the pad 33 and the ring 34. At a number of positions (here four) around the groove there are provided "bridges" or supports 35, on which light sources 18 such as SSLs are mounted. The light sources 18 are here mounted with one terminal connected to the central pad 33, and a second terminal connected to the ring 34. Hereby the SSLs 18 will be parallel connected by the pad 33 and the ring 34. The openings 36 here extend all the way between the supports 35, thereby providing a larger access to the inside of the ridge 14.

Similar to the lamp 11 in FIG. 2, two tongue-shaped electrodes 19, here formed at the end of the ring 34 and on the pad 33, respectively, extend towards the neck portion of the bulb. The electrodes 19 may be electrically connected to driver circuitry 20. In FIG. 3, the driver circuitry is arranged on a driver carrier 21, such as a PCB, and the electrodes 19 are spring loaded against the driver carrier 21. By contacting the electrodes 19, the driver circuitry 20 is parallel connected to the SSLs, and may operate the SSLs 18 to emit light.

Figure 4:
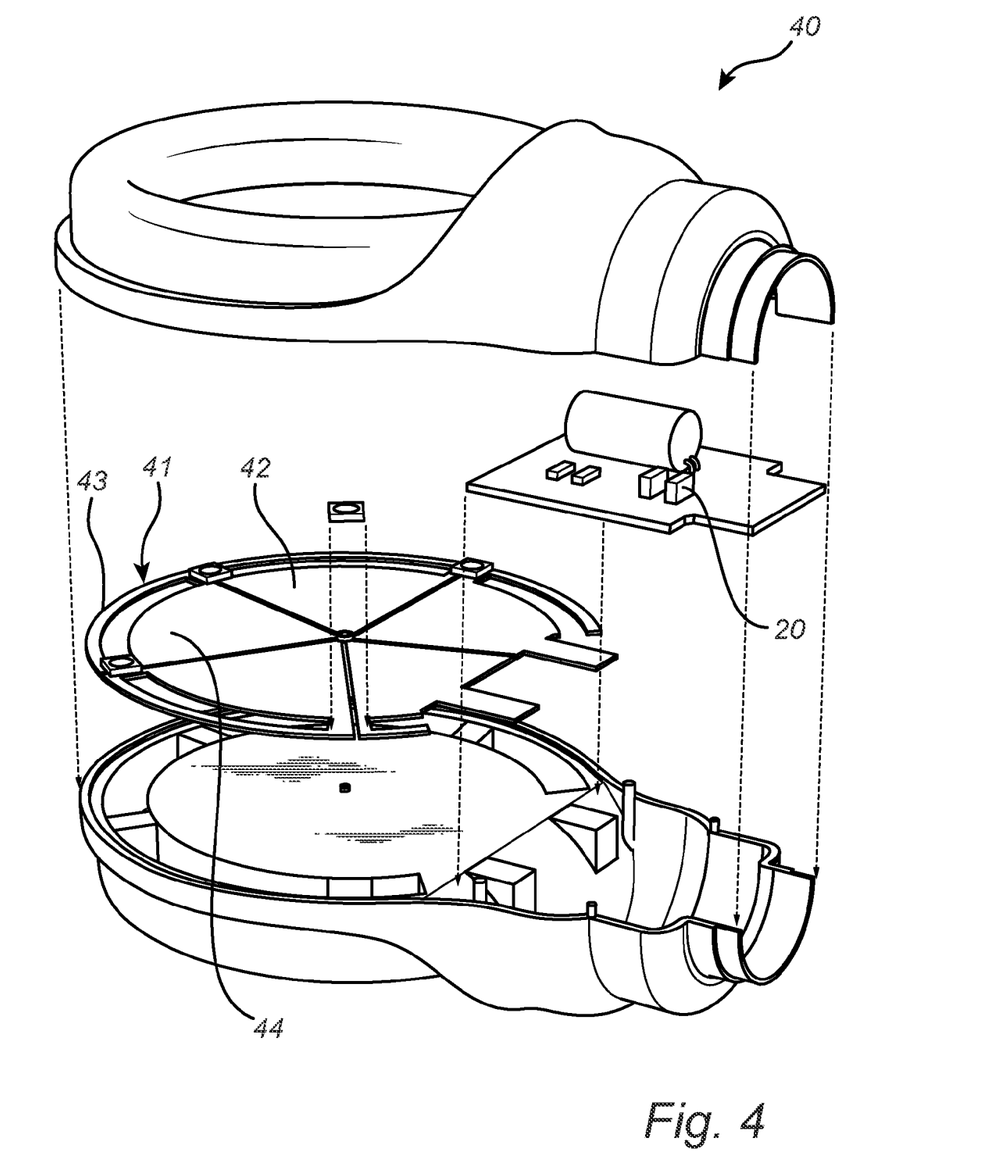
FIG. 4 shows a flat lamp according to a fourth embodiment of the present invention.

The lamp 40 in FIG. 4 is similar to the lamp 30 in FIG. 3, and identical or similar parts have been given the same reference numbers.

Just like the layer 32, the conducting layer 41 of the light source carrier here includes a central disc 42 and a peripheral ring 43. However, the layer 41 is here structured into five pie-shaped pads 44, more like the layer 15 in FIG. 2. Similar to the embodiment in FIG. 3, the SSLs 18 are mounted on supports 35. However, in FIG. 4 the SSLs 18 are serially connected between the pads 44, to form a serially connected string of SSLs. The connection of driver circuitry 20 may also be similar to that in FIG. 2.

Figure 5:
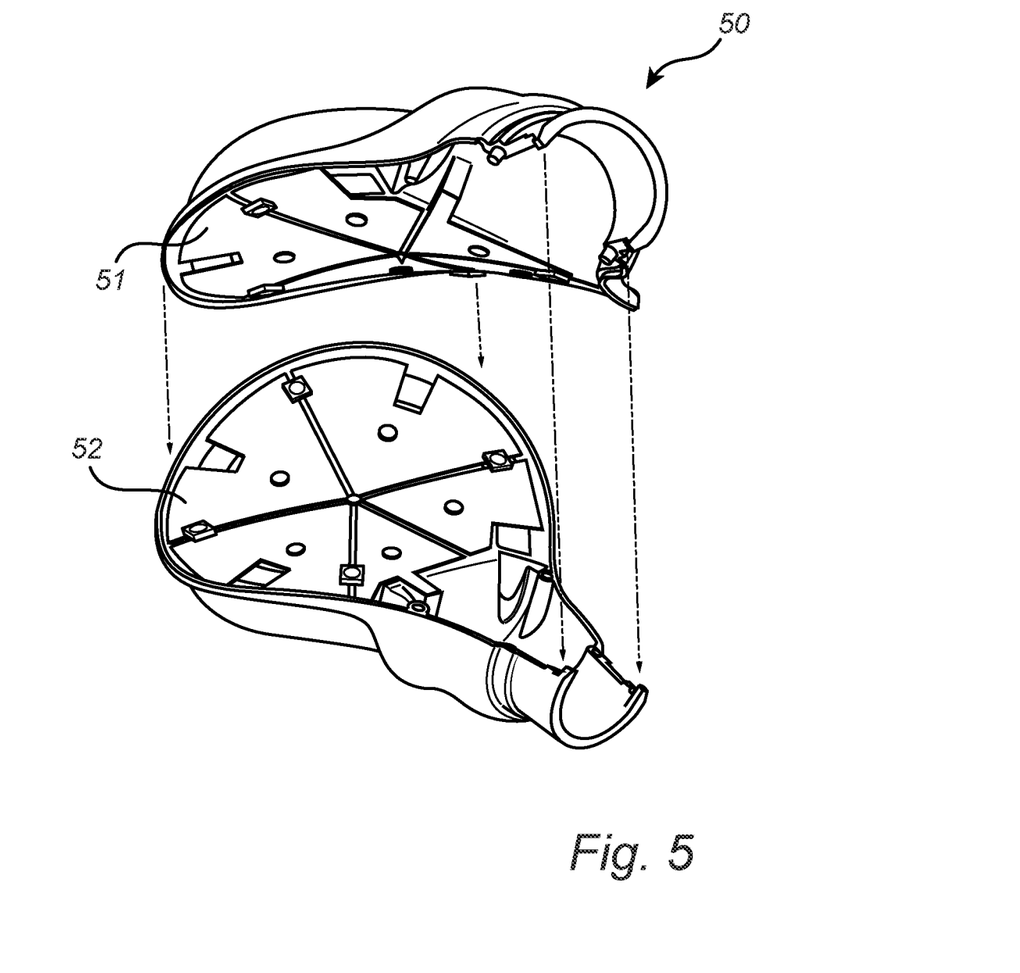
FIG. 5 shows a flat lamp according to a fifth embodiment of the present invention.

FIG. 5 shows a lamp 50 according to yet another embodiment of the present invention. In this embodiment, a light source carrying surface 51 of each cover member is not limited to one plane, but is curved in space. As a consequence, the SSLs 18 mounted on the surface 51 will have non-parallel optical axis A, leading to an improved light distribution. The conducting layer 52 in FIG. 5 is structure in a similar way as the layer 15 in FIG. 2. Structuring similar to those in FIGS. 3 and 4 would also be possible on a curved surface.

The person skilled in the art realizes that the present invention by no means is limited to the preferred embodiments described above. On the contrary, many modifications and variations are possible within the scope of the appended claims, including the number and location of light sources and light transmitting portions.

Further, the exact form and shape of the conducting pads of the structured conducting layer may depend on the type of light sources and their properties. If LEDs with an asymmetrical thermal design are used, heat will be mostly transferred via one side of the led to the pad connected to that side. This pad should therefore be larger than the pad connected to the other side. If LEDs with a symmetrical thermal design are used, both sides dissipate an equal amount of heat. The pads connected to a LED can then be of equal size, and the last and first pads in a serial string should be about half the size of the intermediate pads.

Further, the electrically conducting layer (tracks) providing power to the SSLs may be separated from the thermally conducting layer dissipating heat from the SSLs. This may be realized with two different, isolated copper layers, one for heat spreading and one for electrical contact.

The invention claimed is:
1. A lighting device comprising:
a light emitting portion with at least two solid state light sources, SSL,
said light emitting portion including:
a first cover member with a first light source carrier and a first light transmitting portion, wherein said first light transmitting portion includes a first opening extending through said first light source carrier;
a second cover member with a second light source carrier and a second light transmitting portion, wherein said second light transmitting portion includes a second opening extending through said second light source carrier,
a first SSL mounted on a first surface of said first light source carrier, and
a second SSL mounted on a second surface of said second light source carrier,
said first and second cover member being arranged with said first surface of said first light source carrier facing said second surface of said second light source carrier, such that said first opening of said first light transmitting portion is aligned with said second SSL to allow direct transmission of light emitted from said second SSL through said first opening and first cover member, and said second opening of said second light transmitting portion is aligned with said first SSL to allow direct transmission of light emitted from said first SSL through said second opening and second cover member.

2. The lighting device according to claim 1, wherein each cover member is formed of a transparent, translucent or tinted material and wherein each light transmitting portion includes a part of the cover member.

3. The lighting device according to claim 1, wherein the first cover member and the second cover member are of essentially equal geometrical design.

4. The lighting device according to claim 1, wherein each first and second cover member comprises at least two light transmitting parts, said light emitting portion comprising one SSL aligned with each light transmitting part.

5. The lighting device according to claim 1, wherein said first and second light source carriers are non-flat.

6. The lighting device according to claim 1, said first light source carrier comprising a first heat conducting layer on which the first SSL is arranged, such that an amount of heat generated by the first SSL is transmitted into the first layer; and
said second light source carrier comprising a second heat conducting layer on which the second SSL is arranged, such that an amount of heat generated by the second SSL is transmitted into the second layer;
said first layer being in thermal contact with said first cover member to form a first thermal interface between the first layer and the first cover member, and said second layer being in thermal contact with said second cover member to form a second thermal interface between the second layer and the second cover member, and
the first and second thermal interfaces being arranged to transmit a majority of the heat transmitted into the first layer from the first light source, and into the second layer from the second light source, respectively.

7. The lighting device according to claim 1, further comprising driver circuitry for driving said SSLs.

8. The lighting device according to claim 7, wherein said first and second heat conducting layer is formed by a first and second structured electrode layer, respectively, wherein each SSL is electrically and thermally connected to one of said structured electrode layers, and wherein said driver circuitry is electrically connected to each electrode layer.

9. The lighting device according to claim 8, further comprising at least one electrode arranged to connect said first electrode layer to said driver circuitry, and at least one electrode arranged to connect said second electrode layer to said driver circuitry.

10. The lighting device according to claim 9, said first and second cover member each including a bowl-shaped housing, wherein said first and second light source carriers are formed as separate carriers arranged in the housing, and said first and second structured electrode layers are provided on each of said separate carrier respectively.

11. The lighting device according to claim 9, said first and second cover member each including a housing, wherein said first and second light source carriers are formed by an inner surface of said housing, and said first and second electrode layers are formed directly on said inner surface.

12. A method for assembling a lighting device, comprising the steps of:
 providing a light emitting portion with at least two solid state light sources, SSL, said light emitting portion including:
  a first cover member with a first light source carrier and a first light transmitting portion, wherein said first light transmitting portion includes a first opening extending through said first light source carrier, and a second cover member with a second light source carrier and a second light transmitting portion wherein said second light transmitting portion includes a second opening extending through said second light source carrier,
  a first SSL mounted on a first surface of said first light source carrier,
  and a second SSL mounted on a second surface of said second light source carrier;
 arranging said first and second cover member with said first surface of said first light source carrier facing said second surface of said second light source carrier, such that said first opening of said first light transmitting portion is aligned with said second SSL to allow direct transmission of light emitted from said second SSL through said first opening and first cover member, and said second opening of said second light transmitting portion is aligned with said first SSL to allow direct transmission of light emitted from said first SSL through said second opening and second cover member.

13. The method according to claim 12, wherein the first cover member and the second cover member are of essentially equal geometrical design.

14. The method according to claim 12, wherein said first and second light source carriers are non-flat.

* * * * *